(12) United States Patent
Chen

(10) Patent No.: US 7,709,734 B2
(45) Date of Patent: May 4, 2010

(54) ELECTRONIC DEVICE HAVING HOLDING MEMBERS

(75) Inventor: Wei-Hsi Chen, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 796 days.

(21) Appl. No.: 11/616,896

(22) Filed: Dec. 28, 2006

(65) Prior Publication Data

US 2008/0117605 A1 May 22, 2008

(30) Foreign Application Priority Data

Oct. 27, 2006 (TW) .............................. 95219073 U

(51) Int. Cl.
*H05K 5/00* (2006.01)
(52) U.S. Cl. .................. 174/50; 174/520; 174/559; 361/756; 361/679.01; 361/679.02; 312/223.1; 312/223.2
(58) Field of Classification Search .................. 174/50, 174/53, 57, 58, 520, 559, 17 R, 535, 533, 174/542, 560, 563, 1; 220/3.2–3.9, 4.02; 361/600, 601, 727, 725, 801, 724, 726, 679.01, 361/679.02, 679.4, 756, 807, 679.58; 312/223.1, 312/223.2, 223.6
See application file for complete search history.

(56) References Cited

U.S. PATENT DOCUMENTS

| 5,572,402 | A  | * | 11/1996 | Jeong .......................... 361/727 |
| 5,918,956 | A  | * | 7/1999  | Scholder ...................... 361/725 |
| 6,592,195 | B2 | * | 7/2003  | Butterbaugh et al. ......... 361/801 |
| 6,914,773 | B2 | * | 7/2005  | Yang et al. ............. 361/679.02 |
| 7,121,637 | B2 | * | 10/2006 | Fang ..................... 361/679.02 |
| 7,208,686 | B1 | * | 4/2007  | Chen et al. ................... 174/559 |

FOREIGN PATENT DOCUMENTS

TW    M268637    6/2005

* cited by examiner

*Primary Examiner*—Angel R Estrada
(74) *Attorney, Agent, or Firm*—Wei Te Chung

(57) ABSTRACT

An electronic device, comprises a cage (10) and a peripheral component (20). The cage comprises an inner sidewall (14), and an external sidewall (12) parallel to the inner sidewall, a receiving slot (15) formed between the inner sidewall and the external sidewall, and a shaft (152) formed at an end of the receiving slot with two ends of the shaft respectively connected with the inner sidewall and the external sidewall. The external sidewall comprises a plurality of hooks (126) thereon, and the hooks are above and across the receiving slot. The peripheral component defines a groove (22) in a side thereof. The groove corresponds to the shaft. The peripheral component further comprises a plurality of holding slots corresponding to the hooks.

17 Claims, 4 Drawing Sheets

ELECTRONIC DEVICE HAVING HOLDING MEMBERS

BACKGROUND OF THE INVENTION

1. Field of the Invention

The present invention pertains to an electronic device, and particularly to an electronic device having holding members for holding a peripheral component.

2. Description of Related Art

Nowadays, it has been popular that an electronic device, such as a personal computer, defines at least one receiving slot for receiving a peripheral component therein. To properly utilize the electronic device, the peripheral component must be positioned in the receiving slot exactly and steadily. However, conventionally, the peripheral component is directly received in the receiving slot without any holding members. Therefore, the peripheral component may be prone to unintentional disengagement from the receiving slot during use or transportation.

Therefore, a heretofore unaddressed need exists in the industry to overcome the aforementioned deficiencies and inadequacies.

SUMMARY OF THE INVENTION

An electronic device, comprises a cage and a peripheral component. The cage comprises an inner sidewall, and an external sidewall parallel to the inner sidewall, a receiving slot formed between the inner sidewall and the external sidewall, and a shaft formed at an end of the receiving slot with two ends of the shaft respectively connected with the inner sidewall and the external sidewall. The external sidewall comprises a plurality of hooks thereon, and the hooks are above and across the receiving slot. The peripheral component defines a groove in a side thereof. The groove corresponds to the shaft. The peripheral component further comprises a plurality of holding slots corresponding to the hooks.

Other advantages and novel features will become more apparent from the following detailed description when taken in conjunction with the accompanying drawings, in which:

DETAILED DESCRIPTION OF THE INVENTION

Figure 1:
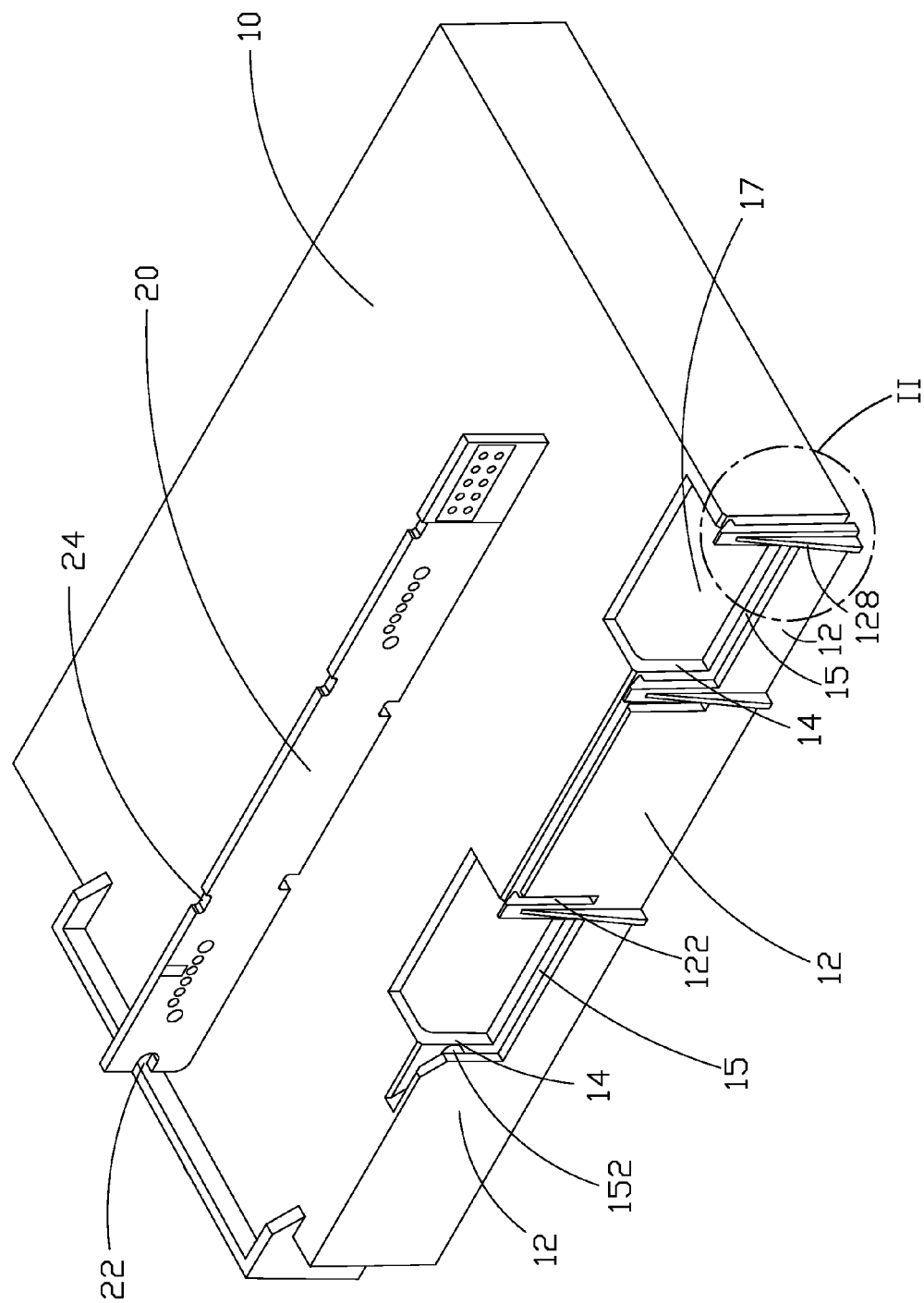
FIG. 1 is an exploded view of an electronic device of an exemplary embodiment of the present invention, the electronic device including a peripheral component.

Referring to FIG. 1, an electronic device of the exemplary embodiment of the present invention comprises a cage 10 and a rectangular peripheral component 20.

The cage 10 comprises an external sidewall 12, an inner sidewall 14 parallel to the external sidewall 12, and a receiving slot 15 formed between the external sidewall 12 and the inner sidewall 14. In the exemplary embodiment, the peripheral component 20 is a circuit board. The external sidewall 12 defines a plurality of openings 17. And the inner sidewall 14 also defines a plurality of openings 17 communicating with an inside of the electronic device, for electrically connecting the peripheral component 20 with electronic elements of the electronic device.

Figure 2:
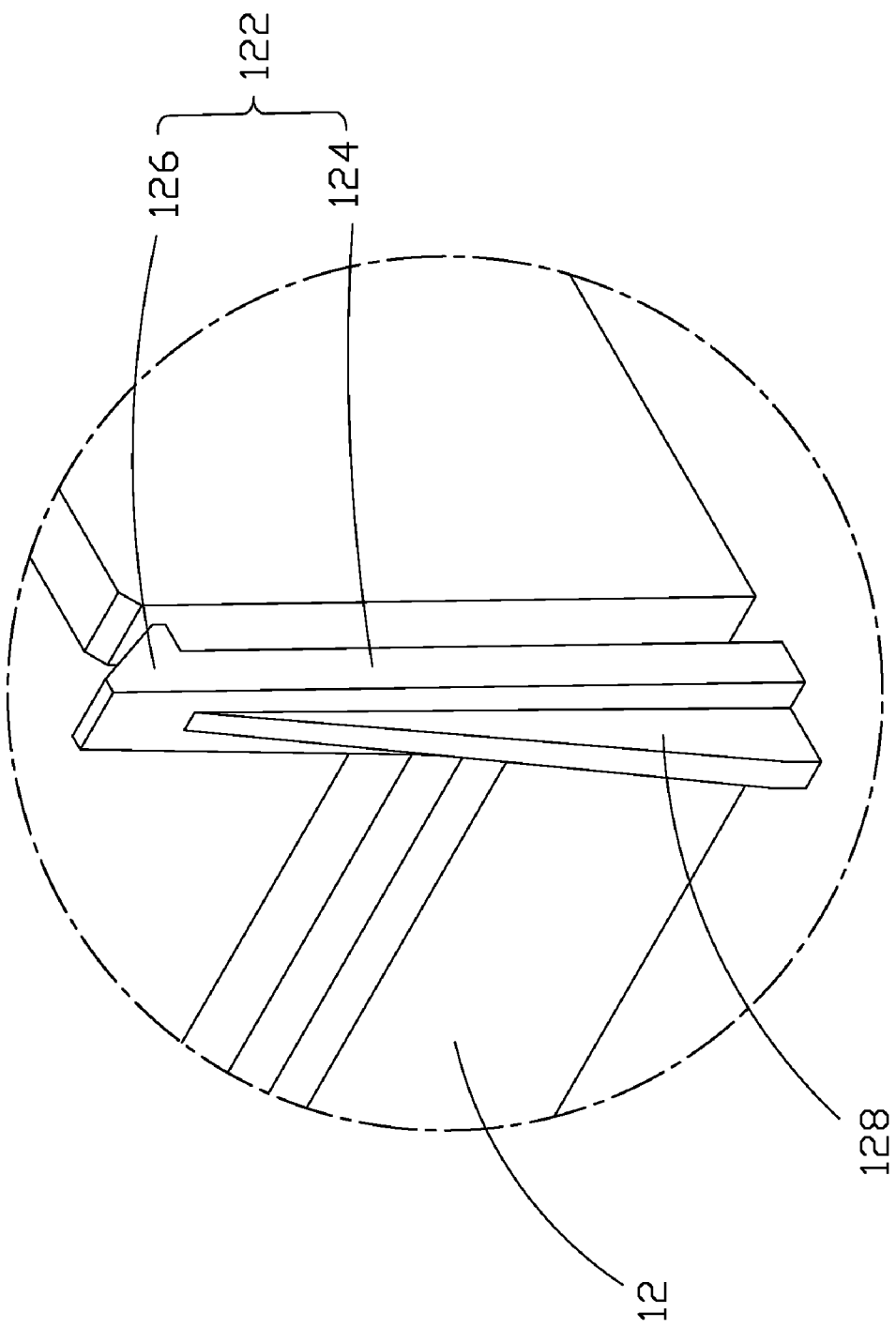
FIG. 2 is an enlarged view of circled portion 11 of FIG. 1.

Referring also to FIG. 2, the external sidewall 12 further comprises a plurality of holding members 122 protruding upwardly from the sidewall 12 and extending into the corresponding openings 17 of the external sidewall 12. Each of the holding members 122 comprises a supporting portion 124 protruding from the external sidewall 12, and a hook 126 formed at an end of the supporting portion 124 and protruding over the receiving slot 15, for catching the peripheral component 20 in the receiving slot 15.

The external sidewall 12 further comprises a plurality of ribs 128 extending from a bottom of the external sidewall 12 to the supporting portion 124, for improving strength of the supporting portion 124.

Referring to FIG. 1, an end of the receiving slot 15 is open, and the other end is closed. A columned shaft 152 is formed at the closed end of the receiving slot 15, with two ends of the shaft 152 being respectively vertically connected to the external sidewall 12 and the inner sidewall 14.

The peripheral component 20 defines a semicircular groove 22 at a side thereof, and the groove 22 corresponds to the shaft 152. A radius of the groove 22 is equal to or slightly greater than that of the shaft 152. In the exemplary embodiment, when the peripheral component 20 is received in the receiving slot 15 with the shaft 152 being receiving in the groove 22, the peripheral component 20 is precisely positioned in a predetermined part of the receiving slot 15, in which the peripheral component 20 can be electrically connected to the electronic elements of the electronic device.

The periphery component 20 further defines a plurality of holding slots 24 formed on an upper side thereof, and corresponding to the hooks 126. A length of the holding slots 24 is equal to that of the hooks 126 so that the hooks 126 can be stably received in the holding slots 24. That is, when the peripheral component 20 is received in the holding slots 24, the peripheral component 20 is prevented from moving about in the receiving slot 15 via the hooks 126 being received in the holding slots 24.

Figure 3:
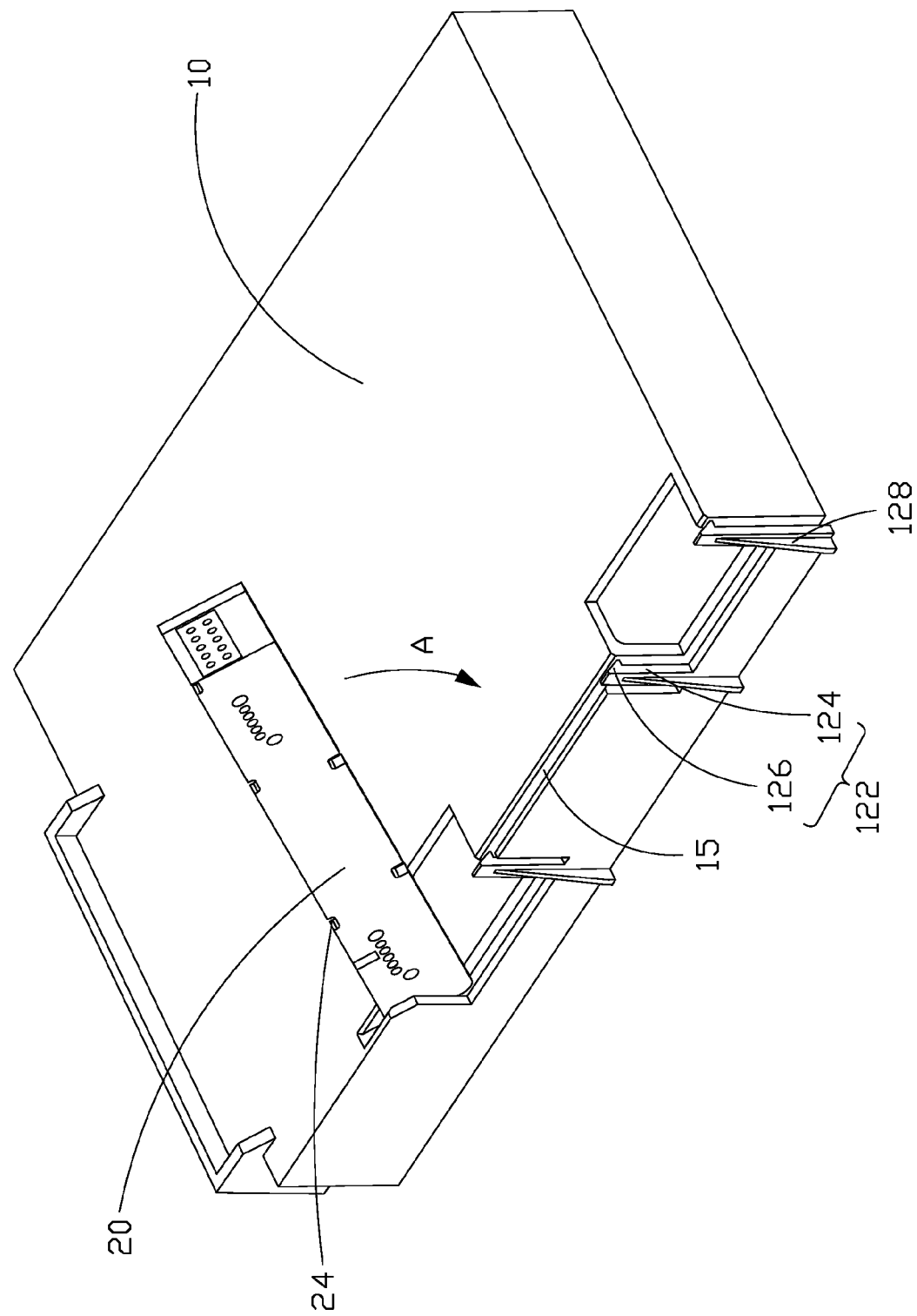
FIG. 3 is a schematic diagram of the peripheral component being mounted to the electronic device of FIG. 1.
Figure 4:
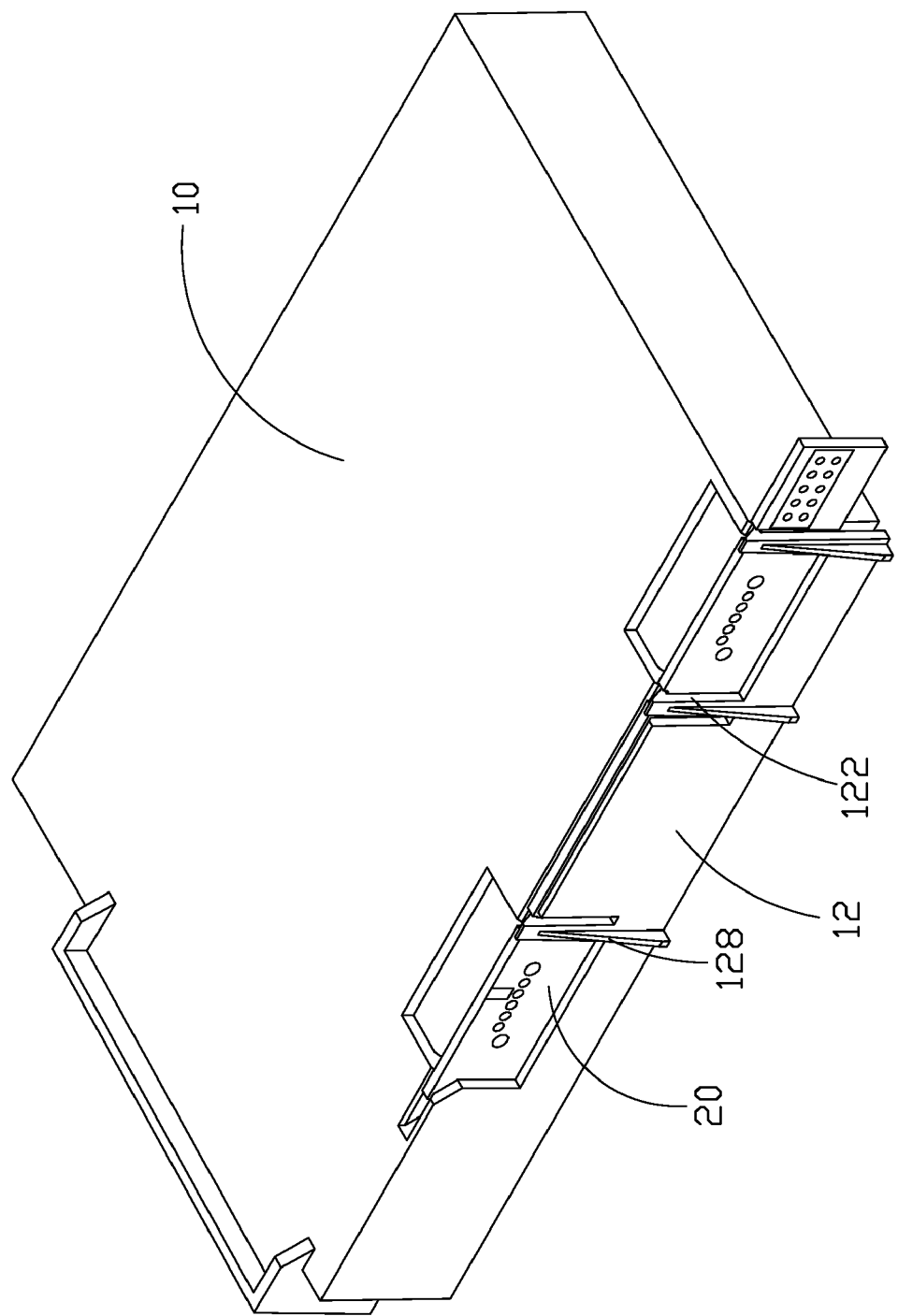
FIG. 4 is an assembled view of the electronic device of FIG. 1.

Referring also to FIG. 3 and FIG. 4, in assembly, the peripheral component 20 is inserted into the receiving slot 15 obliquely with the shaft 152 being received in the groove 22. And then, the peripheral component 20 is pressed down around the shaft 152 along arrow 'A'. When the peripheral component 20 contacts with the holding portion 122, the holding portion 122 is pushed by the peripheral component 20, causing the holding portion 122 to flex outward until the peripheral component 20 is received in the receiving slot 15. In this assembled state, the hooks 126 are received in the holding slots 24, and the shaft 152 is received in the groove 22.

Because the peripheral component 20 is rotated around the shaft 152 in assembly, the peripheral component 20 can be precisely received in the predetermined part of the receiving slot 15 and have a stable electrical connection with the electronic elements of the electronic device.

And further, the peripheral component 20 is latched in the receiving slot 15 by the hooks 126 being received in the holding slots 24 and the shaft 152 being received in the groove 22, resulting in the peripheral component 20 being prevented from moving about in the receiving slot 15.

While the exemplary embodiment has been described above, it should be understood that it has been presented by way of example only and not by way of limitation. Thus the breadth and scope of the present invention should not be limited by the above-described exemplary embodiment, but should be defined only in accordance with the following claims and their equivalents.

What is claimed is:

1. An electronic device, comprising:
   a cage, comprising:
   an inner sidewall;
   an external sidewall parallel to the inner sidewall, the external sidewall comprising a plurality of hooks;
   a receiving slot, formed between the inner sidewall and the external sidewall; and
   a shaft, formed at an end of the receiving slot, and two ends of the shaft respectively connecting with the inner sidewall and the external sidewall,
   a peripheral component, defining a groove in a side thereof, the groove corresponding to the shaft, the peripheral component further comprising a plurality of holding slots corresponding to the hooks,
   wherein, the hooks are formed above and across the receiving slot.

2. The electronic device as claimed in claim 1, wherein the inner sidewall defines a plurality of openings communicating with an inside of the electronic device, through which the peripheral component electrically connects with the electronic device.

3. The electronic device as claimed in claim 1, wherein the external sidewall defines a plurality of openings.

4. The electronic device as claimed in claim 3, wherein the external sidewall comprises a plurality of holding members, each of the holding members comprises a supporting portion formed within the corresponding opening of the external sidewall and protruding from the external sidewall, and the hooks formed on an end of the supporting portion.

5. The electronic device as claimed in claim 4, wherein the external sidewall further comprises a plurality of ribs extending from a bottom of the external sidewall to the supporting portions of the holding members.

6. The electronic device as claimed in claim 1, wherein a length of the holding slots is generally equal to that of the hooks so that the hooks can be unslidably received in the holding slots.

7. The electronic device as claimed in claim 1, wherein the shaft is columnar.

8. The electronic device as claimed in claim 7, wherein two ends of the shaft are respectively vertically connected to the inner sidewall and the external sidewall.

9. The electronic device as claimed in claim 1, wherein the groove of the peripheral component is semicircular.

10. An electronic device, comprising:
    a cage comprising a receiving slot, a shaft formed at an end of the receiving slot, and a plurality of hooks protruding upwardly from a side of the receiving slot and formed across the receiving slot;
    a peripheral component, the peripheral component defining a groove at an end thereof, and a plurality of holding slots corresponding to the hooks.

11. The electronic device as claimed in claim 10, wherein the cage comprises an inner sidewall, and an external sidewall parallel to the inner sidewall, the receiving slot is formed between the inner sidewall and the external sidewall.

12. The electronic device as claimed in claim 11, wherein the inner sidewall defines a plurality of openings communicating with an inside of the electronic device, through which the peripheral component electrically connects with the electronic device.

13. The electronic device as claimed in claim 11, wherein the external sidewall defines a plurality of openings.

14. The electronic device as claimed in claim 10, wherein a length of the holding slots is generally equal to that of the hooks so that the hooks can be unslidably received in the holding slots.

15. The electronic device as claimed in claim 10, wherein the shaft is columnar.

16. The electronic device as claimed in claim 15, wherein the two ends of the shaft are respectively vertically connected to the inner sidewall and the external sidewall.

17. The electronic device as claimed in claim 10, wherein the groove is semicircular.

\* \* \* \* \*